United States Patent
Ladd et al.

(10) Patent No.: US 7,969,494 B2
(45) Date of Patent: Jun. 28, 2011

(54) IMAGER AND SYSTEM UTILIZING PIXEL WITH INTERNAL RESET CONTROL AND METHOD OF OPERATING SAME

(75) Inventors: John Ladd, Boise, ID (US); Gennadiy A. Agranov, Boise, ID (US)

(73) Assignee: Aptina Imaging Corporation, George Town (KY)

( * ) Notice: Subject to any disclaimer, the term of this patent is extended or adjusted under 35 U.S.C. 154(b) by 903 days.

(21) Appl. No.: 11/802,200

(22) Filed: May 21, 2007

(65) Prior Publication Data

US 2008/0291310 A1    Nov. 27, 2008

(51) Int. Cl.
H04N 3/14   (2006.01)
H04N 5/335  (2006.01)
H01L 31/062 (2006.01)
H01L 31/113 (2006.01)
H01L 27/00  (2006.01)

(52) U.S. Cl. .............. 348/308; 348/294; 250/208.1; 257/292

(58) Field of Classification Search .......... 348/294, 348/308; 250/208.1; 257/292
See application file for complete search history.

(56) References Cited

U.S. PATENT DOCUMENTS

| | | | |
|---|---|---|---|
| 5,654,755 A | 8/1997 | Hosier | |
| 5,710,446 A | 1/1998 | Chi et al. | |
| 6,018,365 A | 1/2000 | Merrill | |
| 6,130,713 A | 10/2000 | Merrill | |
| 6,392,263 B1 | 5/2002 | Chen et al. | |
| 6,603,513 B1 | 8/2003 | Berezin | |
| 6,777,660 B1 * | 8/2004 | Lee | 250/208.1 |
| 6,809,766 B1 | 10/2004 | Krymski et al. | |
| 6,900,485 B2 | 5/2005 | Lee | |
| 6,950,131 B1 | 9/2005 | Kleinhans et al. | |
| 6,958,776 B2 * | 10/2005 | Mendis et al. | 348/308 |
| 7,019,345 B2 * | 3/2006 | Pain et al. | 257/292 |
| 7,116,368 B2 | 10/2006 | Berezin et al. | |
| 2004/0227832 A1 * | 11/2004 | Loose | 348/308 |
| 2005/0092894 A1 * | 5/2005 | Fossum | 250/208.1 |
| 2005/0151867 A1 | 7/2005 | Goto et al. | |
| 2006/0261246 A1 | 11/2006 | Krymski | |
| 2007/0252182 A1 * | 11/2007 | Beck | 257/292 |
| 2008/0169845 A1 * | 7/2008 | Xu | 327/94 |
| 2008/0291310 A1 * | 11/2008 | Ladd et al. | 348/308 |

FOREIGN PATENT DOCUMENTS

| | | |
|---|---|---|
| EP | 1 017 107 A2 | 7/2000 |
| EP | 1 017 231 A2 | 7/2000 |
| EP | 1 143 706 A2 | 10/2001 |
| EP | 1 237 353 A1 | 9/2002 |
| WO | WO 2006/119333 | 11/2006 |

OTHER PUBLICATIONS

CMOS Image Sensors Comprised of Floating Diffusion Driving Pixels With Buried Photodiode; Keiji Mabuchi, et al., IEEE Journal of Solid-State Circuits, vol. 39, No. 12, Dec. 2004; pp. 2408-2416.
CMOS Active Pixel Image Sensors Fabricated Using a 1.8-V, 0.25-m CMOS Technology; Hon-Sum Philip Wong, et al., IEEE Transactions on Electron Devices, vol. 45, No. 4, Apr. 1998; pp. 889-894.

* cited by examiner

*Primary Examiner* — Nhan T Tran
*Assistant Examiner* — Tuan H Le
(74) *Attorney, Agent, or Firm* — Nancy Y. Ru (57) ABSTRACT

A pixel having no dedicated reset control line. By using the voltage on the column line to control the gate of the reset transistor, there is no need to provide a dedicate reset control line.

20 Claims, 12 Drawing Sheets

IMAGER AND SYSTEM UTILIZING PIXEL WITH INTERNAL RESET CONTROL AND METHOD OF OPERATING SAME

FIELD OF THE INVENTION

Embodiments of the invention relate generally to improved semiconductor imaging devices and in particular to the manner of operating an array of pixels.

BACKGROUND OF THE INVENTION

Figure 1:
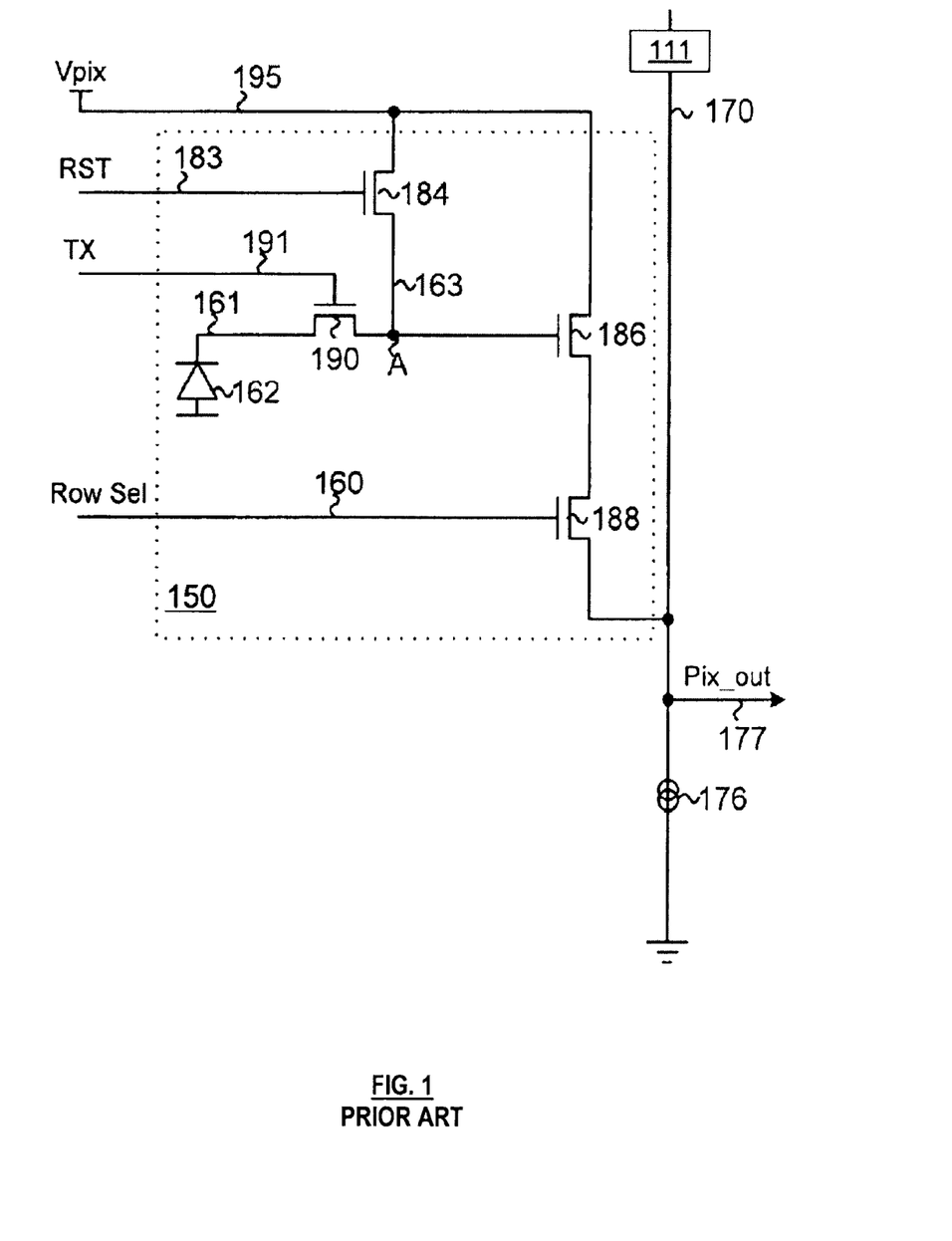
FIG. 1 is an electrical schematic diagram of a conventional imager pixel.

A conventional four transistor (4T) circuit for a pixel 150 of a CMOS imager is illustrated in FIG. 1. The FIG. 1 pixel 150 is a 4T pixel, where 4T is commonly used in the art to designate use of four transistors to operate the pixel. The 4T pixel 150 has a photosensor such as a photodiode 162, a reset transistor 184, a transfer transistor 190, a source follower transistor 186, and a row select transistor 188. It should be understood that FIG. 1 shows the circuitry for operation of a single pixel 150, and that in practical use, there will be an M×N array of pixels arranged in rows and columns with the pixels of the array accessed using row and column select circuitry, as described in more detail below.

The photodiode 162 converts incident photons to electrons which are selectively passed to a floating diffusion stage node A through transfer transistor 190 when activated by the TX control signal. The source follower transistor 186 has its gate connected to node A and thus amplifies the signal appearing at the floating diffusion node A. When a particular row containing pixel 150 is selected by an activated row select transistor 188, the signal amplified by the source follower transistor 186 is passed on a column line 170 to column readout circuitry. The photodiode 162 accumulates a photo-generated charge in a doped region of the substrate. It should be understood that the pixel 150 may include a photogate or other photon to charge converting device, in lieu of a photodiode, as the initial accumulator for photo-generated charge.

The gate of transfer transistor 190 is coupled to a transfer control signal line 191 for receiving the TX control signal, thereby serving to control the coupling of the photodiode 162 to node A. A voltage source Vpix is coupled through reset transistor 184 and conductive line 163 to node A. The gate of reset transistor 184 is coupled to a reset control line 183 for receiving the Rst control signal to control the reset operation in which the voltage source Vpix is connected to node A.

A row select signal (Row Sel) on a row select control line 160 is used to activate the row select transistor 180. Although not shown, the row select control line 160 used to provide a row select signal (Row Sel) is coupled to all of the pixels of the same row of the array, as are the RST and TX lines. Voltage source Vpix is coupled to transistors 184 and 186 by conductive line 195. A column line 170 is coupled to all of the pixels of the same column of the array and typically has a current sink 176 at its lower end. The upper part of column line 170, outside of the pixel array, includes a pull-up circuit 111 which is used to selectively keep the voltage on the column line 170 high. Maintaining a positive voltage on the column line 170 during an image acquisition phase of a pixel 150 keeps the potential in a known state on the column line 170. Signals from the pixel 150 are therefore selectively coupled to a column readout circuit (FIGS. 2-4) through the column line 170 and through a pixel output ("Pix_out") line 177 coupled between the column line 170 and the column readout circuit.

As known in the art, a value can be read from pixel 150 in a two step correlated double sampling process. First, node A is reset by activating the reset transistor 184. The reset signal (e.g., Vpix) found at node A is readout to column line 170 via the source follower transistor 186 and the activated row select transistor 188. During a charge integration period, photodiode 162 produces a charge from incident light. This is also known as the image acquisition period. After the integration period, transfer transistor 190 is activated and the charge from the photodiode 162 is passed through the transfer transistor to node A, where the charge is amplified by source follower transistor 186 and passed to column line 170 through the row select transistor 188. As a result, two different voltage signals—the reset signal and the integrated charge signal—are readout from the pixel 150 and sent on the column line 170 to column readout circuitry where each signal is sampled and held for further processing as known in the art. Typically, all pixels in a row are readout simultaneously onto respective column lines 170 and the column lines may be activated in sequence for pixel reset and signal voltage readout.

Figure 2:
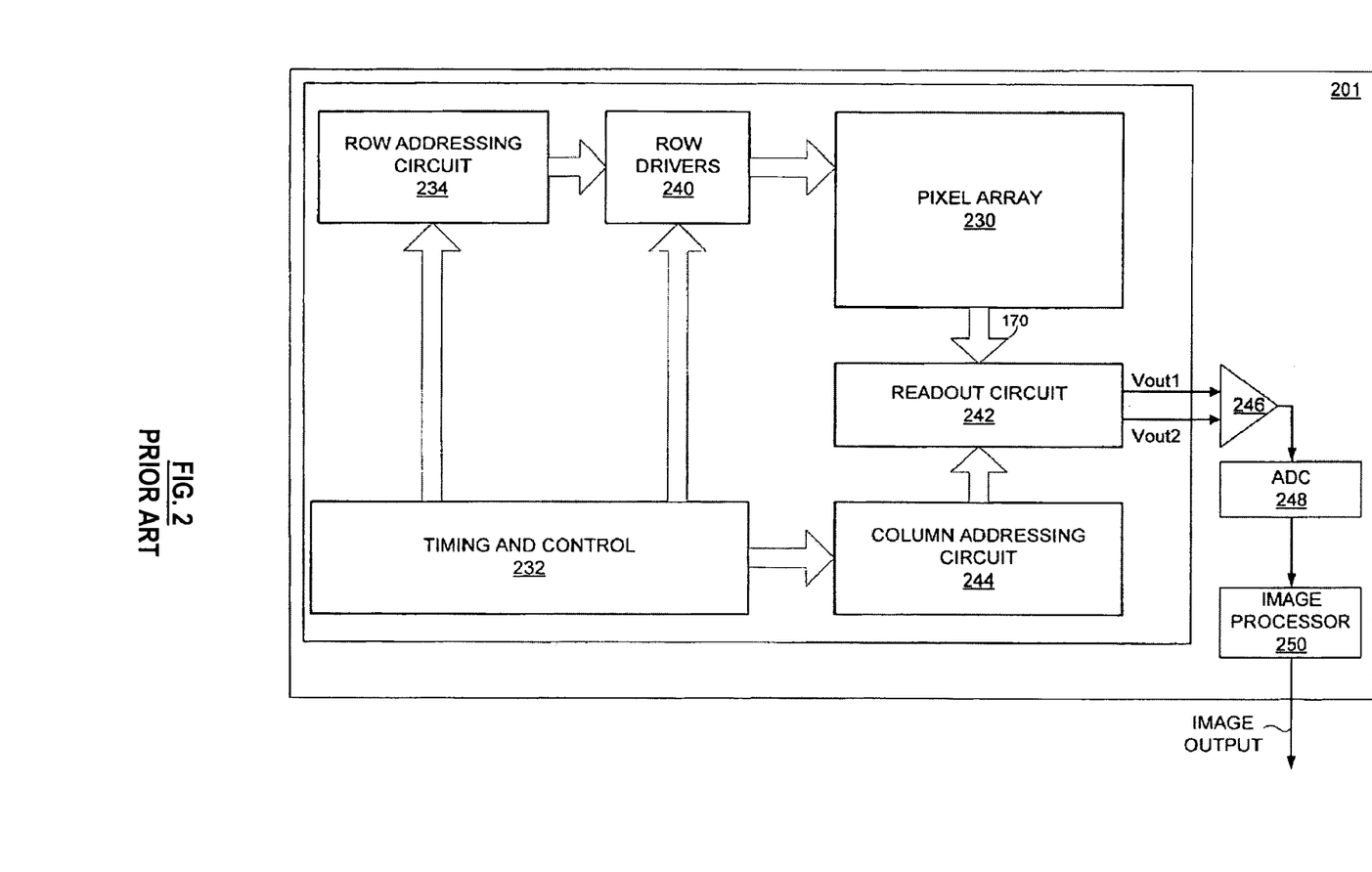
FIG. 2 is a block diagram of a conventional imager chip.

FIG. 2 shows an example CMOS imager integrated circuit chip 201 that includes an array 230 of pixels and a controller 232, which provides timing and control signals to enable reading out of signals stored in the pixels in a manner commonly known to those skilled in the art. Exemplary arrays have dimensions of M×N pixels, with the size of the array 230 depending on a particular application. The pixel signals from the array 230 are readout a row at a time using a column parallel readout architecture. The controller 232 selects a particular row of pixels in the array 230 by controlling the operation of row addressing circuit 234 and row drivers 240. Signals corresponding to charges stored in the selected row of pixels and reset signals are provided on the column lines 170 to a column readout circuit 242 in the manner described above. The pixel signal read from each of the columns can be readout sequentially using a column addressing circuit 244. Pixel signals (Vrst, Vsig) corresponding to the readout reset signal and integrated charge signal are provided as respective outputs Vout1, Vout2 of the column readout circuit 242 where they are subtracted in differential amplifier 246, digitized by analog to digital converter 248, and sent to an image processor circuit 250 for image processing.

Figure 3:
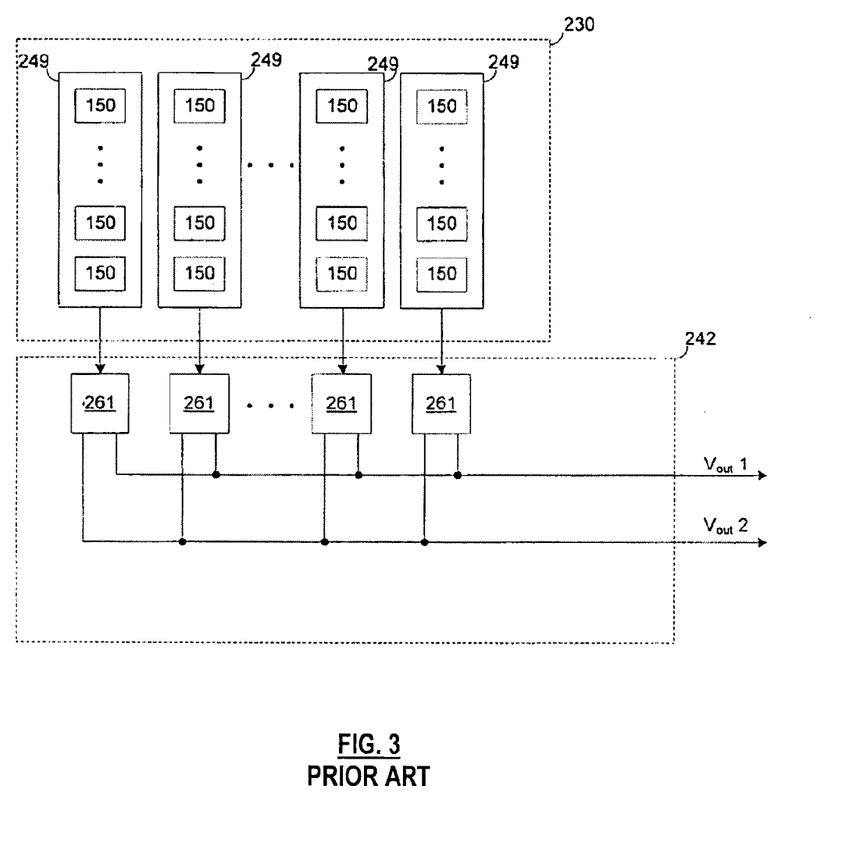
FIG. 3 is a block diagram of an array of pixels illustrated in FIG. 2 and an associated column readout circuit.

FIG. 3 shows more details of the rows and columns 249 of active pixels 150 in an array 230. Each column includes multiple rows of pixels 150. Signals from the pixels 150 in a particular column can be readout to sample and hold circuitry 261 associated with the column 249 (part of circuit 242) for acquiring the pixel reset and integrated charge signals. Signals stored in the sample and hold circuits 261 can be read sequentially column-by-column to the differential amplifier 246 which subtracts the reset and integrated charge signals and sends them to an analog-to-digital converter (ADC) 248.

Figure 4:
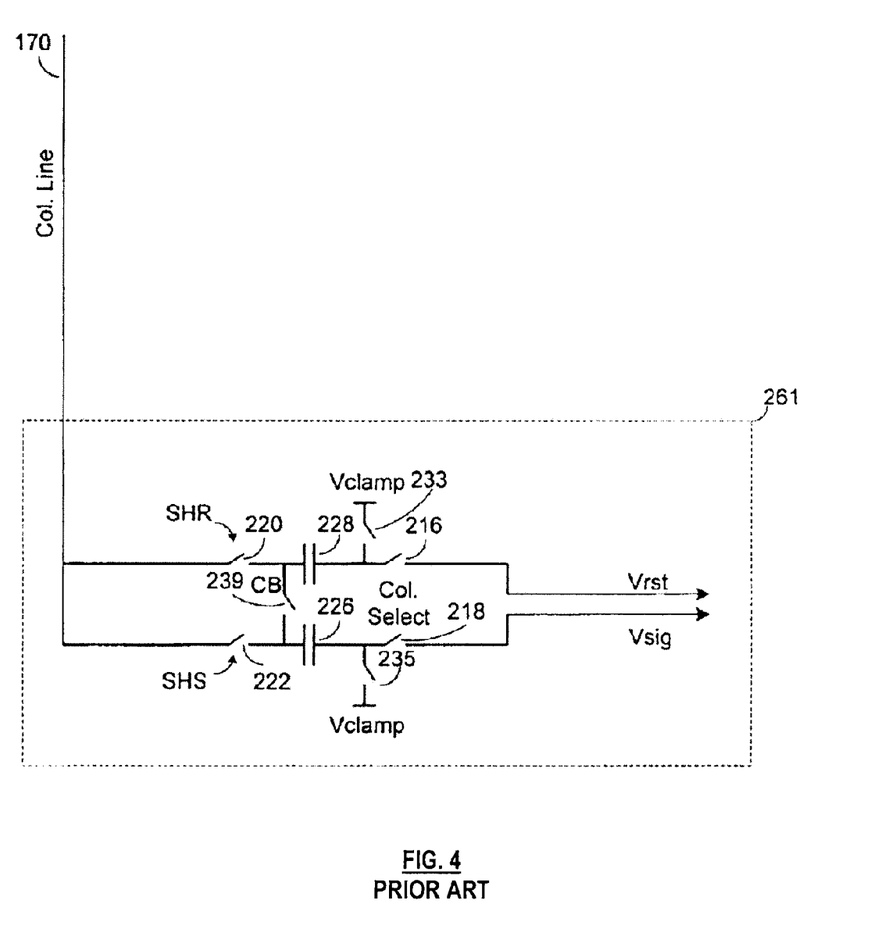
FIG. 4 is a conventional sample and hold circuit.

FIG. 4 illustrates a portion of the sample and hold circuit 261 of FIG. 3 in greater detail. The sample and hold circuit 261 holds a set of signals, e.g., a reset signal and an integrated charge signal from a desired pixel. For example, a reset signal of a desired pixel on column line 170 is stored on capacitor 228 and the integrated charge signal is stored on capacitor 226.

Figure 5:
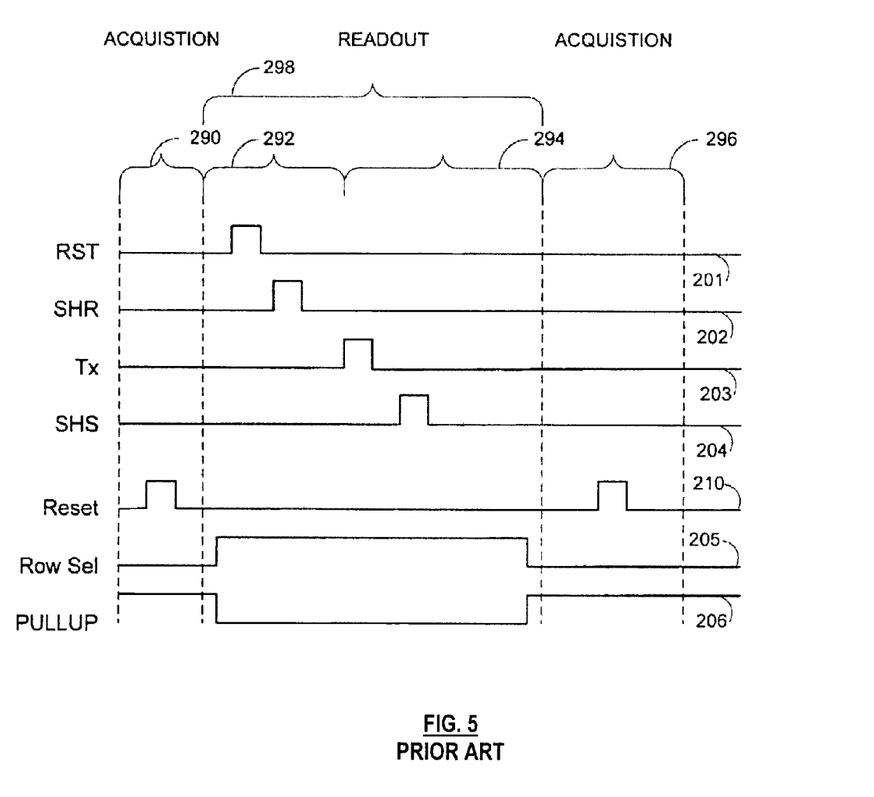
FIG. 5 is a simplified timing diagram associated with operation of the circuitry of FIGS. 1-4.

The operation of the circuits illustrated in FIGS. 1-4 is now described with reference to the simplified signal timing diagram of FIG. 5. During an image acquisition/reset period 290, the pull-up circuit 111 is enabled (via the PULLUP signal) to maintain the column line 170 at a high level and the signal on the row select line 160 is set to a logic low to disable the row select transistor 188 and isolate the pixel 150 from the column line 170. The reset control signal Rst is pulsed onto line 183, whereby node A of the pixel 150 is reset by the reset voltage Vpix.

A readout period 298 for pixel 150 is separated into a readout period 292 for the readout of the reset signal, and a readout period 294 for the readout of the integrated charge signal. To begin the overall readout period 298, the pull-up circuit 111 is disabled to no longer maintain the column line 170 at a high level and the signal on the row select line 160 is set to a logic high to enable the row select transistor 188 and couple the pixel 150 to the column line 170. To begin the reset signal readout period 292, the reset signal RST is enabled placing the reset voltage Vpix on node A which is transferred to the column line 170 via source follower transistor 186 and row select transistor 188 and stored in capacitor 228 when the SHR pulse is applied to switch 220 of the sample and hold circuit 261 (FIG. 4). Thus, reset signal (Vrst) of the desired pixel 150 is sampled and stored on capacitor 228. After the reset signal is stored, the reset readout period 292 ends.

After the reset readout period 292 ends, an integrated charge signal readout period 294 begins. Transfer transistor 190 is enabled by a transfer control signal Tx being pulsed on line 191. The integrated charge which has been integrating at photodiode 162 is transferred onto Node A. Subsequently, the integrated charge signal on node A is transferred onto the column line 170 via source follower transistor 186 and row select transistor 188 and stored in capacitor 226 when an SHS signal is applied to switch 222 of the sample and hold circuit 261 (FIG. 4). The SHS switch 222 (FIG. 4) of the sample and hold circuit 261 is closed thereby storing an integrated charge pixel signal on capacitor 226. The reset and integrated charge signals stored in the sample and hold circuit 261 for the column are now available for the differential readout circuit. The integrated charge signal readout period 294 and the readout period 298 is completed. As part of the next acquisition/reset period 296, the pull-up circuit 111 is enabled to maintain the column line 170 at a high level and the signal on the row select line 160 is set to a logic low to disable the row select transistor 188 and isolate the pixel 150 from the column line 170. Node A of pixel 150 is reset by reset voltage Vpix during the acquisition/reset period 296.

The circuitry described above requires space in an imager. However, there exists a need to reduce the size of imagers, and thus, it would be desirable to eliminate circuitry from pixels which could help reduce the size which also helps improve the pixel fill factor by permitting a larger area for the photodiode.

DETAILED DESCRIPTION OF THE INVENTION

In the following detailed description, reference is made to the accompanying drawings, which form a part hereof, and in which is shown by way of illustration specific embodiments. These embodiments are described in sufficient detail to enable those of ordinary skill in the art to make and use them, and it is to be understood that structural, logical, or procedural changes may be made.

The embodiments described herein provide an improved imager and method of operation where the reset transistor is controlled by the signal on the column line. This control arrangement reduces the circuitry required to operate the pixel array of the imager. Dedicated reset control lines and corresponding row drivers are eliminated to reduce the area needed for a pixel and the associated circuitry.

Figure 6:
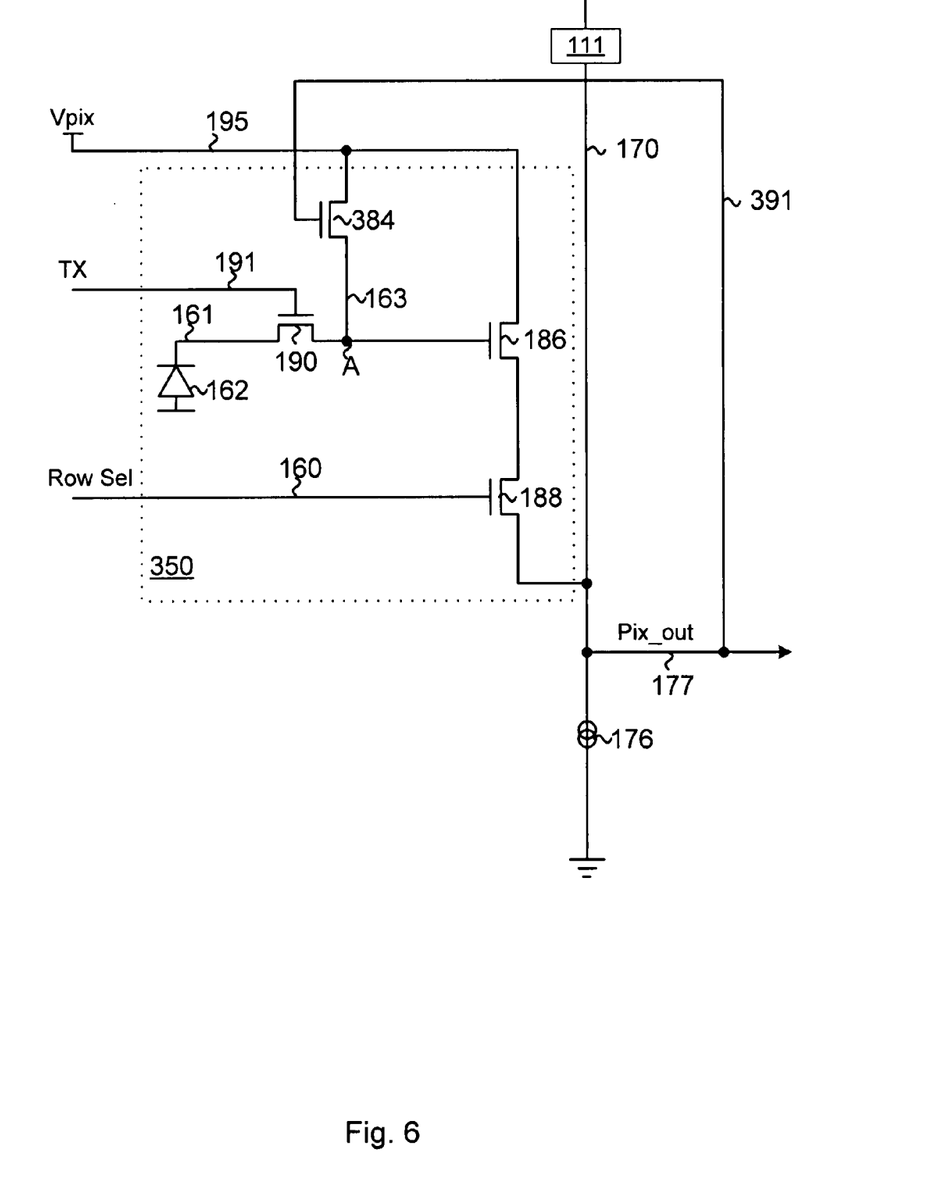
FIG. 6 is an electrical schematic diagram of a pixel in accordance with an embodiment of the invention.

According to a first embodiment of a pixel shown in FIG. 6, the gate of the reset transistor 384 is coupled to and controlled by a signal on the column line 170 through a signal on the Pix_out line 177. According to a second embodiment shown in FIG. 8, the gate of the reset transistor 584 and the source of the reset transistor 584 may be coupled to the signal on the column line 170 through the Pix_out 177 line. According to a third embodiment shown in FIG. 9, a plurality of photodiodes, e.g. 1261, 1262, 1263, and associated transfer transistors, e.g. 1281, 1282, 1283, share a floating diffusion node A and the gate of a common reset transistor 1284 is coupled to the signal on a column line 170 through Pix_out line 177. In a fourth embodiment shown in FIG. 10, a plurality of photodiodes, e.g. 1261, 1262, 1263, and associated transfer transistors, e.g. 1281, 1282, 1283, share a floating diffusion node A and the gate and the source of a common reset transistor 1384 are coupled to the signal on the column line through the Pix_out line 177.

Referring to FIG. 6, it depicts a pixel 350 according to a first embodiment. The pixel 350 is similar to pixel 150 of FIG. 1 except that the gate of the reset transistor 384 is no longer coupled to a reset control line, but instead, the gate of the reset transistor 384 is coupled to the Pix_out line 177 through line 391. The drivers and circuitry required to control and drive the dedicated reset control line 183 (FIG. 1) are eliminated. In this embodiment, the signal on the Pix_out line 177 is used to reset the floating diffusion node A, thus maintaining the operation of the 4T pixel. Thus when the pull-up circuit 111 is enabled and applying a positive voltage to the column line 170, a positive voltage is also applied through the Pix_out line 177 and line 391 to the gate of the reset transistor 384. Applying a positive voltage to the gate of the reset transistor 384 activates the transistor 384 and couples the floating diffusion node A to the voltage source Vpix.

The remaining structures of pixel 350 and their operations correspond to like structures and their operations as described above with respect to FIG. 1.

The threshold of the reset transistor 384 affects the voltage of the floating diffusion node A ($V_{FD}$). If the threshold of reset transistor 384, $V_{rs\_th}$, is zero (0), then subsequent to a reset operation, the voltage of the floating diffusion node A $V_{FD}$, is equal to Vpix. If the reset transistor 384 threshold is not zero, then subsequent to a reset $V_{FD}$ operation, the voltage on node A, $V_{FD}$, is:

$$V_{FD}=V_{Pix}-V_{rst\_th} \tag{1}$$

Figure 7:
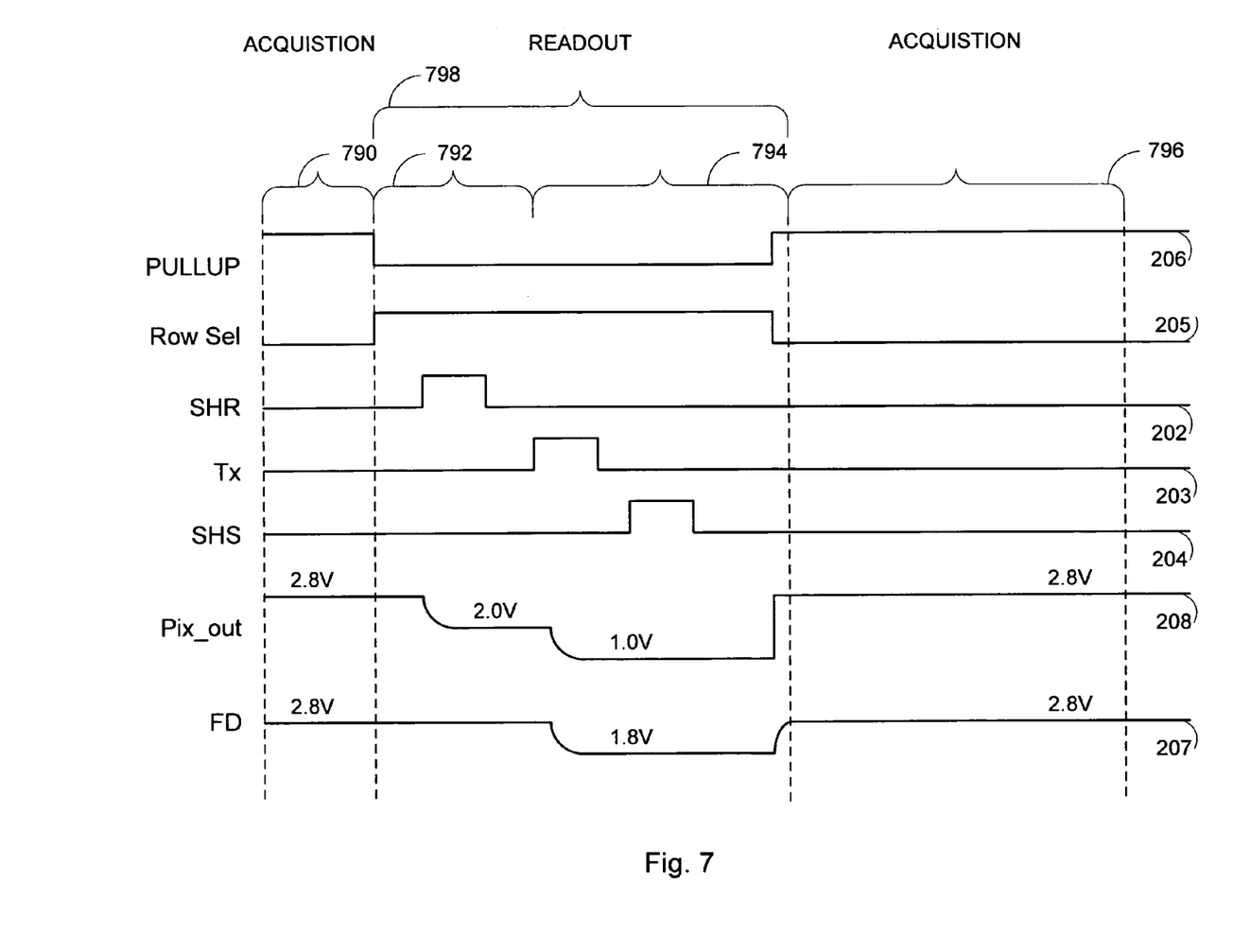
FIG. 7 is a timing diagram associated with the pixel of FIG. 6.

The operation of the circuit of FIG. 6 is now described with reference to the simplified signal timing diagram of FIG. 7. The timing diagram is illustrative of the timing of a readout of a pixel from a pixel array, as well as a portion of an acquisition/reset period that precedes and a portion of another acquisition/reset period that follows the readout period. This timing diagram of FIG. 7 is representative of the readout of each of the pixels from a pixel array.

Line 202 represents the SHR signal used to store a reset signal on a sample and hold capacitor for storing the reset signal. When SHR is logic high, switch 220 (FIG. 4) is closed and capacitor 228 is coupled to the column line 170. When SHR is logic low, switch 220 is open and capacitor 228 is uncoupled from the column line 170.

Line 203 (FIG. 7) represents the Tx control signal at a given time. When the Tx control signal is logic high, Tx transistor 190 (FIG. 6) is activated and photodiode 162 is coupled to floating diffusion node A. When the Tx control signal is logic low, Tx transistor 190 is open and photodiode 162 is uncoupled from floating diffusion node A. Line 204 (FIG. 7) represents the SHS signal used to store a integrated charge signal on a sample and hold capacitor for storing integrated charge signals. When SHS is logic high, switch 222 (FIG. 4) is closed and capacitor 226 is coupled to the column line 170. When SHS is logic low, switch 222 is open and capacitor 226 is uncoupled from the column line 170.

Line 205 (FIG. 7) represents the Row Sel signal at a given time. When the Row Sel signal is logic high, row select transistor 188 (FIG. 6) is activated and pixel 350 is coupled to the column line 170. When the Row Sel signal is logic low, row select transistor 188 is open and pixel 350 is uncoupled from the column line 170. Line 206 (FIG. 7) represents the PULLUP signal controlling the pull-up circuit 111 at a given time. When PULLUP is logic high, pull-up circuit 111 (FIG. 6) is enabled and providing a voltage on column line 170. When PULLUP is logic low, pull-up circuit 111 is disabled and not providing a voltage on column line 170. Line 207 (FIG. 7) represents the voltage on the Pix_out line 177 (FIG. 6) at a given time. Line 208 (FIG. 7) represents the voltage on the floating diffusion (FD) node A (FIG. 6) at a given time.

During an acquisition/reset period 790, the pull-up circuit 111 is enabled (logic high PULLUP signal) to maintain the column line 170 at a high level and the row select (Row Sel) signal on the row select line 160 is set to a logic low to disable the row select transistor 188 and isolate the source follower transistor 186 from the column line 170. During acquisition/reset period 790, the integrated charge signal is being accumulated by photodiode 162. Also during the acquisition/reset period 790, since the Pix_out line 177 is coupled to the column line 170, the Pix_out line 177 is at a high level, which activates reset transistor 384, thereby coupling floating diffusion node A to the reset voltage Vpix. Assuming that pull-up circuit 111 provides a 2.8V voltage and also assuming that there is no significant loss of voltage in the circuit, then when pull-up circuit 111 is at a high level and therefore Pix_out line 177 is at a high level, the voltage on Pix_out line 177 is equivalent to the voltage provided by the pull-up circuit, 2.8V.

As depicted in FIG. 7, the voltage on Pix_out line 177 (FIG. 7, line 208) during the acquisition/reset period 790 is 2.8V. Similarly, when a floating diffusion node A is reset to Vpix, the $V_{FD}$ voltage on node A is 2.8V (FIG. 7, line 207), assuming no voltage loss in the circuit. In most implementations, the $V_{FD}$ is related to the physical properties of the reset transistor, as indicated above with respect to Eq. (1). Thus, a reset signal is provided to the floating diffusion node A without a dedicated reset line such as the one shown in FIG. 1.

A readout period 798 for pixel 350 is separated into a readout period 792 for the readout of the reset signal, and a readout period 794 for the readout of the integrated charge signal. To begin the overall readout period 798, the pull-up circuit 111 is disabled to no longer maintain the column line 170 at a high level and the Row Sel signal on the line 160 is set to a logic high to enable the row select transistor 188 and couple the pixel 350 to the column line 170.

To begin the reset signal readout period 792, the reset signal on floating diffusion node A is transferred to the column line 170 via source follower transistor 186 and row select transistor 188 and stored in capacitor 228 when the SHR pulse is applied to switch 220 of the readout circuit 242 (FIG. 4). Thus, the reset signal (e.g., Vrst) of the desired pixel 350 is sampled and stored on capacitor 228. After the reset signal is stored, the reset readout period 792 ends.

After the reset readout period 792 ends, the integrated charge signal readout period 794 begins. Transfer transistor 190 is enabled by a transfer control signal Tx being pulsed on line 191. The integrated charge from photodiode 162 is transferred onto floating diffusion node A. Subsequently, the integrated charge signal on floating diffusion node A is transferred onto the column line 170 via source follower transistor 186 and row select transistor 188 and stored in capacitor 226 when the SHS signal is applied to switch 222 of the column readout circuit 242 (FIG. 4). The SHS switch 222 of the column readout circuit 242 is closed thereby storing an integrated charge pixel signal on capacitor 226. The reset and integrated charge signals stored in the sample and hold circuits 242 for the column are now available for the differential readout circuit 246 (FIG. 2). The integrated charge signal readout period 794 and the readout period 798 is completed.

As depicted in FIG. 7, the voltage on Pix_out line 177 (FIG. 7, line 208) and the floating diffusion node A (FIG. 7, line 207) changes during the readout period 798. During the reset readout period 792, when the Row_sel is enabled the voltage on the Pix_out line 177 decreases due to the threshold voltage on source follower transistor 186. The voltage on the gate of the reset gate 384 is also reduced, which builds a barrier for a potential wall on the floating diffusion node A equivalent to:

$$V_B = V_{SF\_th} \tag{2}$$

If $V_{SF\_th}$ 32 0.8V, then the voltage on the Pix_out line 177 drops to 2.0V.

During the integrated charge signal readout period 794, the voltage on the Pix_out line 177 decreases due the transferring the charge from the photodiode 162 to the floating diffusion node A equivalent to $Q/C_{FD}$, where Q is the capacitance of the photodiode 162 and $C_{FD}$ is the capacitance of the floating diffusion node A. In the example of FIG. 7, $Q/C_{FD}=1$, thus the voltage on Pix_out line 177 decreases 1.0 V. Correspondingly, the voltage on the Pix_out line and the reset gate 384 is reduced to 1.0V.

With the reduction of the voltage on the Pix_out line 177, the barrier on the potential wall on the floating diffusion node A is $$V_c = V_{SF\_th} + Q/C_{FD} \tag{2}$$

Thus, $Q/C_{FD}=1.8$ V as depicted in FIG. 7.

As part of the next acquisition/reset period 796, the pull-up circuit 111 is enabled to maintain the column line 170 at a high level and the signal on the row select line 160 is set to a logic low to disable the row select transistor 188 and isolate the pixel 350 from the column line 170. Although not shown, node A of pixel 350 is reset by reset voltage Vpix during the acquisition/reset period 796 in a similar manner as described above, whereby the pull-up circuit 111 is enabled to maintain the column line 170 at a high level and the signal on the row select line 160 is set to a logic low to disable the row select transistor 188 and isolate the source follower transistor 186 of pixel 350 from the column line 170. Similar to acquisition/reset period 790, during acquisition period 796 the voltage on node A and on Pix_out line 177 is reset to 2.8V.

Therefore, the pixel can be operated without the need for a dedicated reset line and associated circuitry. This can decrease the size required for the image sensor and corresponding circuitry. Additionally, using the invention can maintain and/or increase barriers between voltages.

Figure 8:
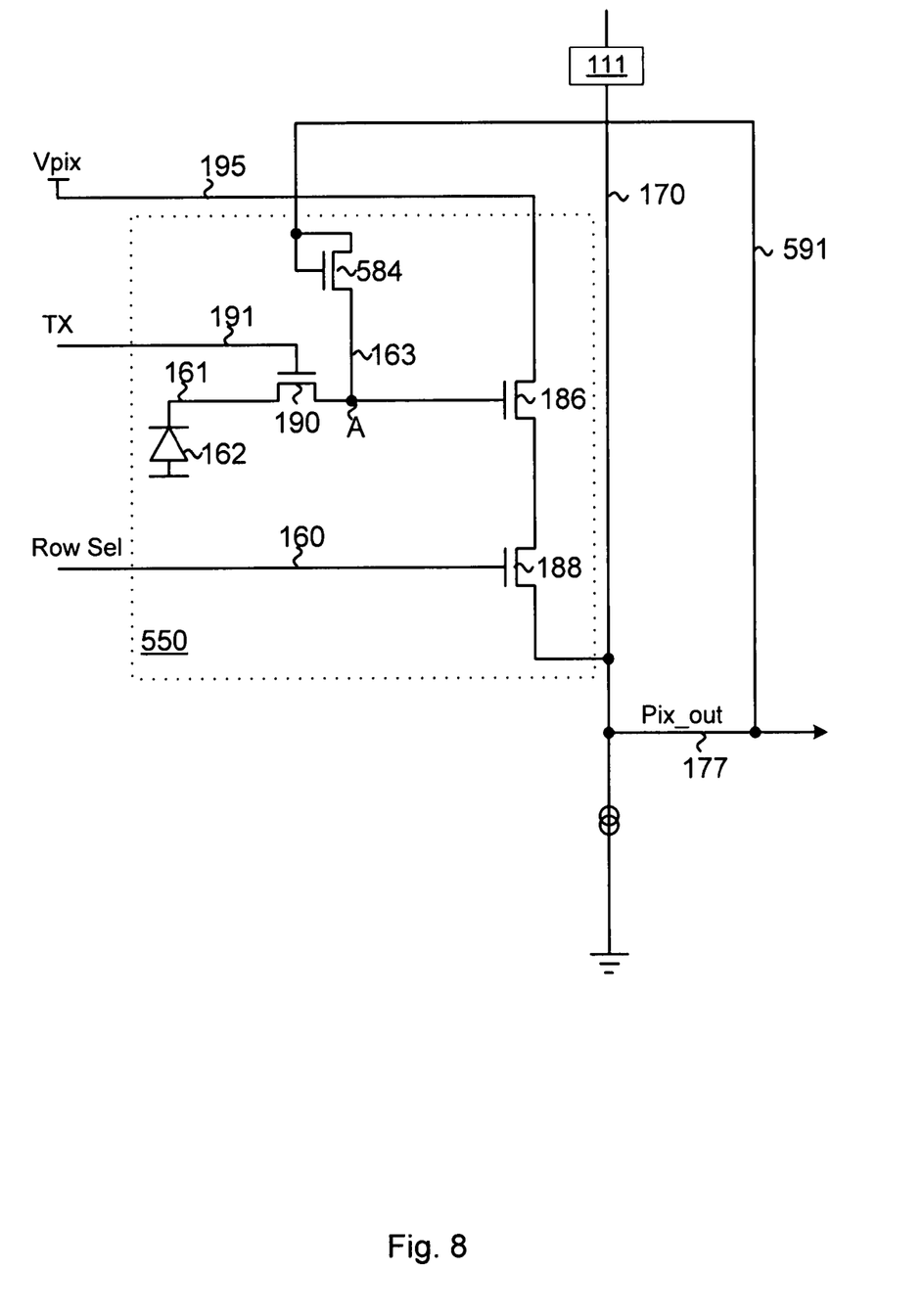
FIG. 8 is an electrical schematic diagram of a pixel in accordance with another embodiment of the invention.

FIG. 8 depicts a pixel 550 according to a second embodiment. The pixel 550 is similar to pixel 350 of FIG. 6 except that one source/drain of reset transistor 584 is coupled to floating diffusion node A and the other source/drain of reset transistor 584 is coupled to the pull up voltage on the column line 170 through Pix_out line 177, i.e., the other source/drain of reset transistor 584 is coupled to the gate of reset transistor 584. The method of operating the pixel 550 is similar to the method of operating pixel 350 as described above with respect to FIG. 7, except here the operating voltage for reset transistor 584 is also taken from the voltage on column line 170. The arrangement of having a source/drain of reset transistor 584 is coupled to the gate of reset transistor 584 is also known as a diode connected transistor.

Although the embodiments described utilize a single pixel, they are not so limited and are also applicable to shared pixel arrays in which more than one photosensor from different pixels are switchably coupled to a common floating diffusion node.

Figure 9:
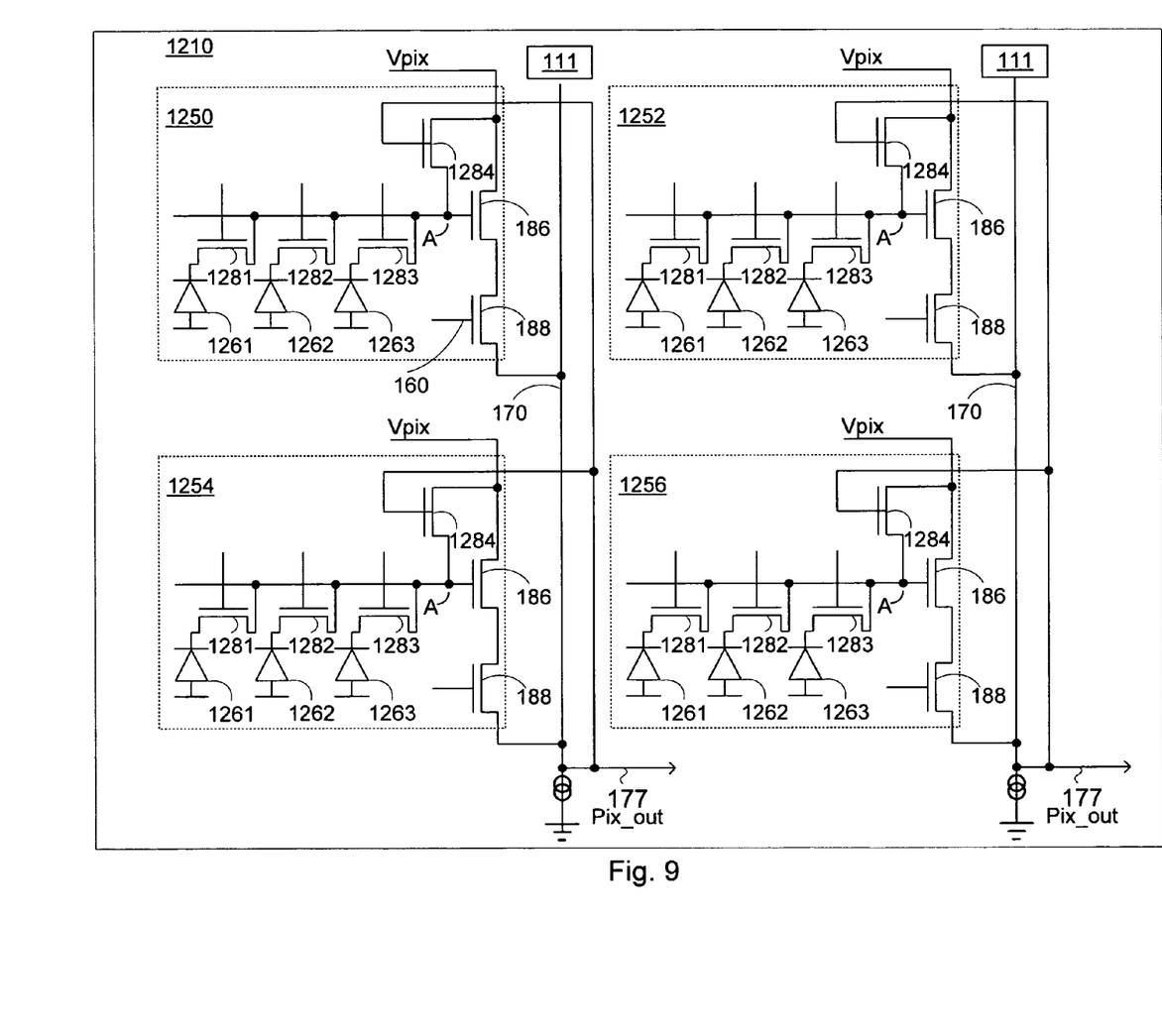
FIG. 9 is an electrical schematic diagram of a portion of a pixel array showing a floating diffusion node shared by pixels in accordance with another embodiment of the invention.

FIG. 9 depicts a shared floating diffusion pixel array 1210 according to another embodiment described herein. The pixel array 1210 is depicted having M×N pixels circuits where each pixel circuit has a shared floating diffusion node A, a reset transistor 1284, a source follower transistor 186, a row select transistor 188, transfer transistors 1281, 1282, and 1283, and photodiodes 1261, 1262 and 1263 respectively coupled to the transfer transistor. Each photodiode, e.g., 1261, and associated transfer transistor, e.g. 1281, is a pixel which shares a pixel readout circuit with other pixels. Circuit 1250 is similar in architecture to pixel 150 of FIG. 6, with a difference in that circuit 1250 has several photodiodes 1261, 1262, 1263 switchably coupled through respective transfer transistors 1281, 1282, and 1283 to a common floating diffusion node A. Although FIG. 9 is shown with two rows of two circuits 1250, 1252 and 1254, 1256, each having three photodiodes 1261, 1262, 1263, implementation of the array 1210 is not so limited. Similar to pixel 350 of FIG. 6, the gate of the reset transistor 1284 is coupled to the voltage on the column line 170 through the Pix_out line 177.

A reset operation of circuit 1250 is similar to the reset operation of circuit 350 of FIG. 6 in that after each integrated charge signal is transferred out of the circuit 1250, the node A is reset by the column pull-up circuitry 111.

Figure 10:
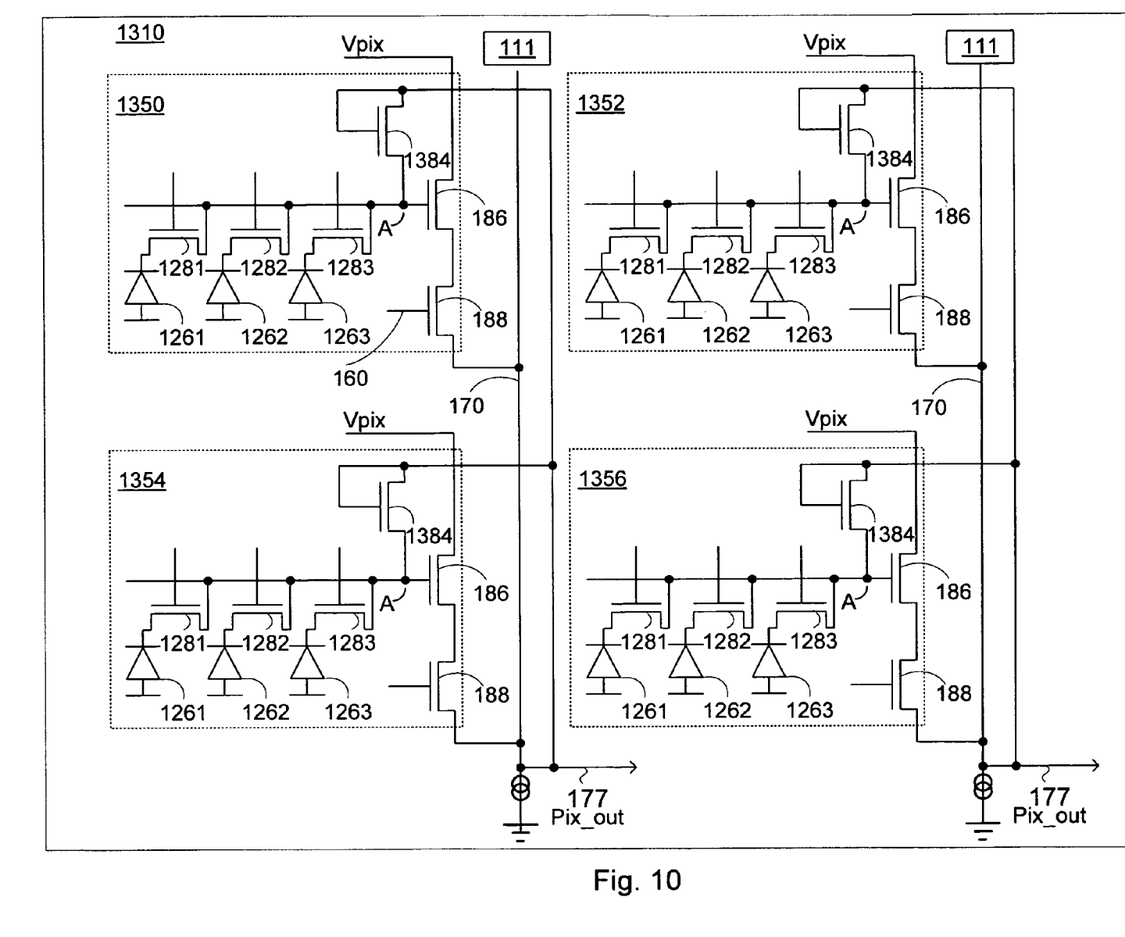
FIG. 10 is an electrical schematic diagram of a portion of a pixel array showing a floating diffusion node shared by pixels in accordance with yet another embodiment of the invention.

FIG. 10 depicts a pixel array 1310 in another embodiment. The pixel array 1310 is depicted having M×N pixel circuits where each pixel circuit has a shared floating diffusion node A, a reset transistor 1384, a source follower transistor 1386, a row select transistor 1388, transfer transistors 1381, 1382, 1383, and photodiodes 1361, 1362, 1363 respectively associated with the transfer transistor. Each photodiode, e.g. 1261, and associated transfer transistor, e.g. 1281, is a pixel which shares a readout circuit with other pixels. Circuit 1350 is similar in architecture to pixel 550 of FIG. 8, with a difference in that circuit 1350 has several photodiodes 1361, 1362, 1363 switchably coupled through respective transfer transistors 1381, 1382, 1383 to a common floating diffusion node A. Although FIG. 10 is shown with two rows of two circuits 1350, 1352 and 1354, 1356, each having three photo diodes 1261, 1262, 1263, implementation of the pixel array is not so limited. Similar to pixel 550 (FIG. 8), the gate and the drain of each reset transistor 1384 is coupled to the voltage on the column line 170 through the Pix_out line 177.

A reset operation of circuit 1350 is similar to the reset operation of circuit 550 of FIG. 8 in that after integrated charge signals are transferred out of each of the circuits, e.g., 1350, 1352, in a row, the floating diffusion node A in each of the circuits 1350, 1352, is reset by the column pull-up circuitry 111.

Figure 11:
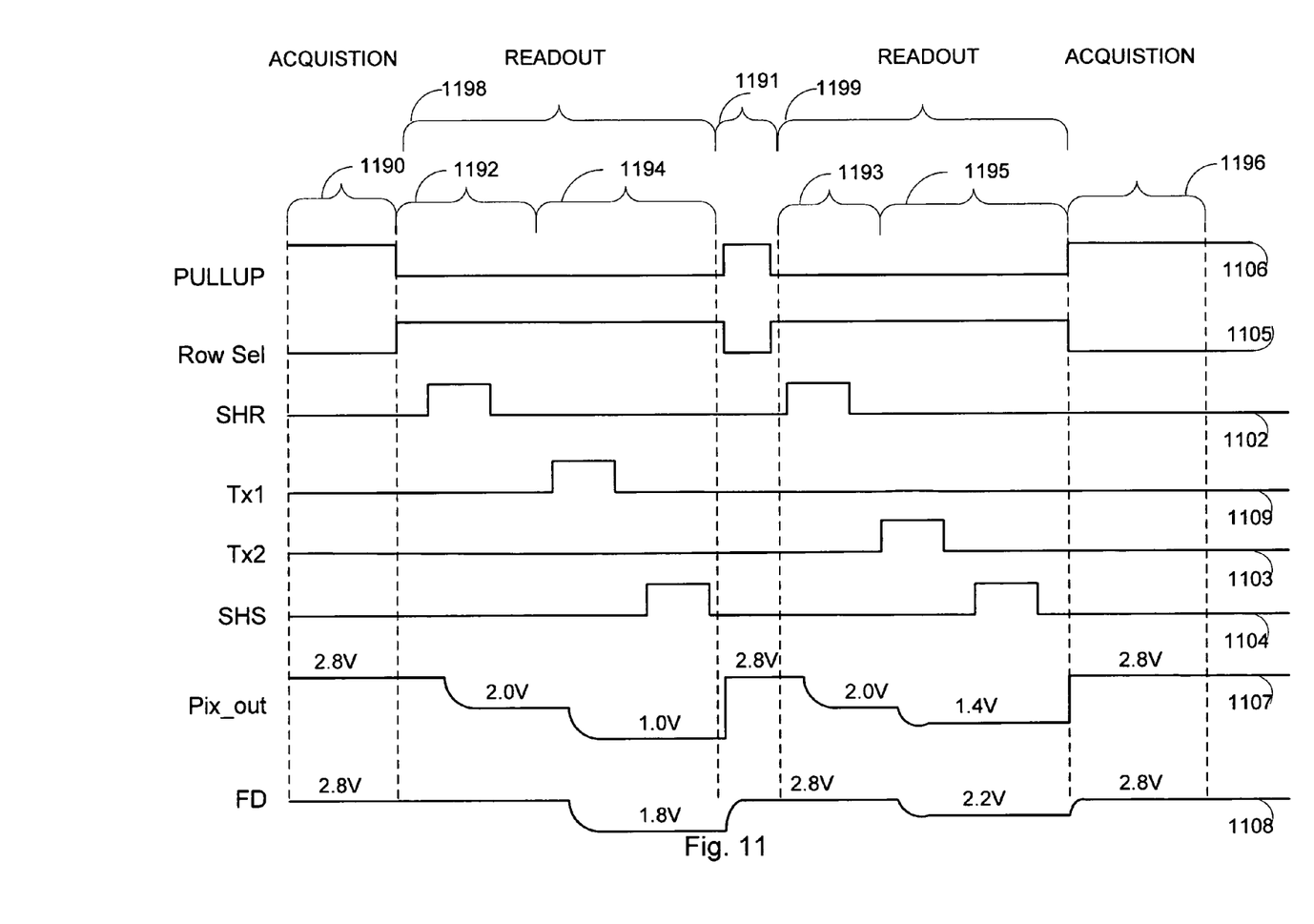
FIG. 11 is a timing diagram associated with the operation of the pixels of FIG. 10.

The operation of the circuits of FIG. 9 (and similarly FIG. 10) is now described with reference to the simplified signal timing diagram of FIG. 11. The timing diagram is illustrative of the timing of a readout 1198 of a circuit from a pixel array in which two pixels sharing a common floating diffusion region and readout circuit are readout. FIG. 11 also shows a portion of an acquisition/reset period 1190 that precedes and a portion of another acquisition/reset period 1191 that follows the readout period 1198. The timing diagram is also illustrative of the timing of a readout 1199 of a circuit from a pixel array. This timing diagram of FIG. 11 is representative of the readout of two pixels of each of the circuits 1250, 1252, 1254, 1256, from pixel array 1210.

During an acquisition/reset period 1190, the pull-up circuit 111 is enabled (logic high PULLUP signal) to maintain the column line 170 at a high level and the row select signal on the row select line 160 is set to a logic low to disable the row select transistor 188 and isolate the source follower transistor 186 from the column line 170. During acquisition/reset period 1190, the integrated charge signal accumulated by photodiodes 1261, 1262, 1263. Also during the acquisition/reset period 790, as the Pix_out line 177 is coupled to the column line 170, the Pix_out line 177 is at a high level, and activates reset transistor 1284, thereby coupling floating diffusion node A to the voltage Vpix. Assuming that pull-up circuit 111 provides a 2.8V voltage and also assuming that there is no significant loss of voltage in the circuit, then when pull-up circuit 111 is at a high level and therefore Pix_out line 177 is at a high level, the voltage on Pix_out line 177 and $V_{FD}$ are equivalent to the voltage provided by the pull-up circuit, 2.8V. Thus, a reset signal is provided to the floating diffusion node A without a dedicated reset line such as the one shown in FIG. 1.

A readout period 1198 for circuit 1250 is separated into a readout period 1192 for the readout of the reset signal, and a readout period 1194 for the readout of the integrated charge signal. To begin the overall readout period 1198, the pull-up circuit 111 is disabled to no longer maintain the column line 170 at a high level and the Row Sel signal on line 160 is set to a logic high to enable the row select transistor 188 and couple the circuit 1250 to the column line 170.

To begin the reset signal readout period 1192, the reset signal on floating diffusion node A is transferred to the column line 170 via source follower transistor 186 and row select transistor 188 and stored in capacitor 228 when the SHR pulse is applied to switch 220 of the column readout circuit 242 (FIG. 4). Thus, reset signal Vrst of the desired circuit 1250 is sampled and stored on capacitor 228. After the reset signal is stored, the reset readout period 1192 ends.

After the reset readout period 1192 ends, the integrated charge signal readout period 1194 begins. Transfer transistor 1281 is enabled by a transfer control signal Tx1 being pulsed. The integrated charge from photodiode 1261 is transferred onto floating diffusion node A. Subsequently, the integrated charge signal on floating diffusion node A is transferred onto the column line 170 via source follower transistor 186 and row select transistor 188 and stored in capacitor 226 when an SHS signal is applied to switch 222 of the column readout circuit 242 (FIG. 4). The SHS switch 222 of the column readout circuit 242 is closed thereby storing an integrated charge pixel signal on capacitor 226. The reset and integrated charge signals stored in the sample and hold circuits of the column readout circuit 242 are now available for the differential readout circuit 246. The integrated charge signal readout period 1194 and the readout period 1198 is completed.

As depicted in FIG. 11, the voltage on Pix_out line 177 (FIG. 11, line 1107) and the floating diffusion node A (FIG. 7, line 1108) changes during the readout period 1198. During the reset readout period 1192, similar to that described above with reference to reset period 792 (FIG. 7), the voltage on the Pix_out line 177 drops to 2.0V. During the integrated charge signal readout period 1194, similar to that described above with reference to reset period 1194 (FIG. 7), the voltage on the Pix_out line 177 drops to 1.0V and the voltage on floating diffusion node A is 1.8 V as depicted in FIG. 11.

As part of the next acquisition/reset period 1191, the pull-up circuit 111 is enabled to maintain the column line 170 at a high level and the signal on the row select line 160 is set to a logic low to disable the row select transistor 188 and isolate the circuit 1250 from the column line 170. Floating diffusion node A of circuit 1250 is reset by reset voltage Vpix during the acquisition/reset period 1191 in a similar manner as described above, whereby the pull-up circuit 111 is enabled to maintain the column line 170 at a high level and the signal on the row select line 160 is set to a logic low to disable the row select transistor 188 and isolate the source follower transistor 186 of circuit 1250 from the column line 170.

After the acquisition/reset period 1191, the floating diffusion node A of circuit 1250 has been reset and the circuit 1250 is ready for a readout, e.g., readout 1199, of another photodiode, e.g., 1262, from circuit 1250. The voltage on Pix_out line 177 and $V_{FD}$ are equivalent to the voltage provided by the pull-up circuit, 2.8V. A readout period 1199 for circuit 1250 is separated into a readout period 1193 for the readout of the reset signal, and a readout period 1195 for the readout of the integrated charge signal.

To begin the reset signal readout period 1193, the reset signal on floating diffusion node A is transferred to the column line 170 via source follower transistor 186 and row select transistor 188 and stored in capacitor 228 when the SHR pulse is applied to switch 220 of the column readout circuit 242 (FIG. 4). Thus, reset signal Vrst of the desired circuit 1250 is sampled and stored on capacitor 228. After the reset signal is stored, the reset readout period 1193 ends. During the reset readout period 1193, the voltage on the Pix_out line 177 drops to 2.0V.

After the reset readout period 1193 ends, the integrated charge signal readout period 1195 begins. Transfer transistor 1282 is enabled by a transfer control signal Tx2 being pulsed. The integrated charge from photodiode 1262 is transferred onto floating diffusion node A. Subsequently, the integrated charge signal on floating diffusion node A is transferred onto the column line 170 via source follower transistor 186 and row select transistor 188 and stored in capacitor 226 when an SHS signal is applied to switch 222 of the column readout circuit 242 (FIG. 4). The SHS switch 222 of the column readout circuit 242 is closed thereby storing an integrated charge pixel signal on capacitor 226. The reset and integrated charge signals stored in the sample and hold circuits 242 for the column are now available for the differential readout circuit. The integrated charge signal readout period 1195 and the readout period 1199 is completed. During the integrated charge signal readout period 1195, the readout charge is less than the charge for the first readout 1194, and can be equivalent to 0.6 V. Thus, the voltage on the Pix_out line 177 drops to 1.4V and the charge on the floating diffusion node A drops to 2.2V.

As part of the next acquisition/reset period 1196, the pull-up circuit 111 is enabled to maintain the column line 170 at a high level and the signal on the row select line 160 is set to a logic low to disable the row select transistor 188 and isolate the circuit 1250 from the column line 170. The floating diffusion node A of circuit 1250 is reset by reset voltage Vpix during the acquisition/reset period 1196 in a similar manner as described above, whereby the pull-up circuit 111 is enabled to maintain the column line 170 at a high level and the signal on the row select line 160 is set to a logic low to disable the row select transistor 188 and isolate the source follower transistor 186 of circuit 1250 from the column line 170. Thus, the voltage on the Pix_out line 177 and the floating diffusion node A is reset to 2.8V Thus, at the completion of readout period 1199, two pairs of reset and integrated charge signals are read from the pixel array; a reset signal and an integrated charge signal representative of the integrated charge signal from photodiode 1261 and a second reset signal and an integrated charge signal representative of the integrated charge signal from photodiode 1262. Similarly, the acquisition and readout process is repeated for as many photodiodes 1263, etc. and associated transfer transistors 1283, etc as are sharing a common floating diffusion node A.

Figure 12:
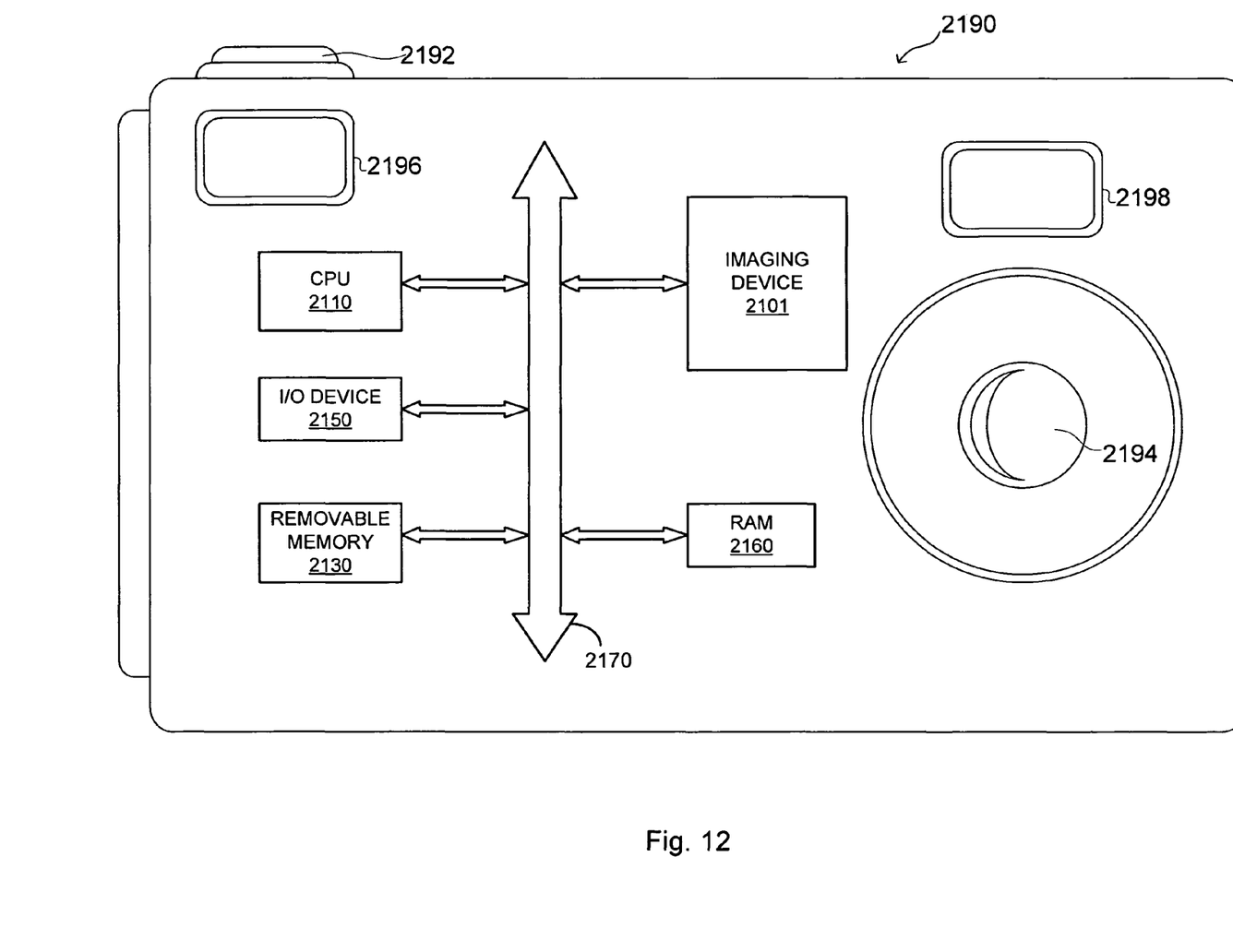
FIG. 12 is a block diagram representation of a processor system, e.g., a camera system, incorporating a CMOS imaging device in accordance with an embodiment of the invention.

FIG. 12 is a block diagram representation of processor system, e.g., a camera system 2190, incorporating an imaging device 2101 in accordance with an embodiment of the invention. A camera system 2190 generally comprises a shutter release button 2192, a view finder 2196, a flash 2198 and a lens system 2194. A camera system 2190 generally also comprises a central processing unit (CPU) 2110, for example, a microprocessor for controlling camera functions which communicates with one or more input/output devices (I/O) 2150 over a bus 2170. The CPU 2110 also exchanges data with random access memory (RAM) 2160 over bus 2170, typically through a memory controller. The camera system may also include peripheral devices such as a removable memory 2130 which also communicates with CPU 2110 over the bus 2170. Imager device 2101 is coupled to the processor system and includes a pixel imaging circuit as described along with respect to FIGS. 6-11. Other processor systems which may employ imaging devices 2101 include computers, PDAs, cell phones, scanners, machine vision systems, and other systems requiring an imager operation.

While the invention has been described and illustrated with reference to specific example embodiments, it should be understood that many modifications and substitutions can be made. Although the embodiments discussed above describe specific numbers of transistors, photodiodes, conductive lines, etc., they are not so limited. Accordingly, the invention is not to be considered as limited by the foregoing description but is only limited by the scope of the claims.

What is claimed as new and desired to be protected by Letters Patent of the United States is:

1. A pixel circuit comprising:
   a photosensor;
   a circuit including a storage node for providing an output signal to a column line based on a signal from said photosensor;

a reset transistor that resets the storage node when activated by the column line, wherein the column line is coupled to a reset voltage source, wherein the reset transistor has a gate, a first source/drain region, and a second source/drain region, wherein the gate is coupled to the column line, and wherein the second source/drain region is coupled to the gate; and a floating diffusion node coupled to the first source/drain region of the reset transistor.

2. The pixel circuit of claim 1, further comprising:
a second photosensor selectively coupled to said floating diffusion node.

3. The pixel circuit of claim 1, further comprising:
a plurality of photosensor regions, each being selectively coupled to said floating diffusion node.

4. An imager comprising:
a pixel array comprising:
  a plurality of pixels, each pixel comprising:
    a photosensor; and
    a transfer transistor; and
  a plurality of pixel readout circuits each associated with one or more pixels comprising:
    a storage region for receiving a charge from a photosensor through an associated transfer transistor;
    a transistor circuit coupled to said storage region for providing an output signal to a column line, said column line being coupled to a switchably operable voltage source; and
    a reset transistor for resetting said storage region, said reset transistor having a gate coupled to said column line, wherein the storage region is coupled to a first source/drain region of the reset transistor and wherein the gate is coupled to a second source/drain region of the reset transistor.

5. The imager of claim 4, wherein said imager further comprises:
a pull-up circuit coupled to said column line.

6. The imager of claim 4, further comprising:
a sample and hold circuit coupled to said column line.

7. The imager of claim 4, wherein said reset transistor is a transistor connected diode.

8. A camera system, comprising:
a processor;
an imager coupled to said processor, said imager comprising:
  a photosensor;
  a circuit including a storage node for providing an output signal to a column line based on a signal from said photosensor; and
  a reset circuit having an reset control line for resetting said storage node, said reset circuit control line being coupled to said column line, wherein the reset circuit comprises a reset transistor having a gate and a first source/drain region, wherein the gate is coupled to said column line, and wherein the first source/drain region is coupled to the gate.

9. The camera system of claim 8, further comprising:
a floating diffusion node coupled to a second source/drain region of the reset transistor.

10. The camera system of claim 9, further comprising:
a second photosensor selectively coupled to said floating diffusion node.

11. The camera system of claim 9, further comprising:
a plurality of photosensor regions, each being selectively coupled to said floating diffusion node.

12. The camera system of claim 8, wherein a reset voltage source is coupled to said column line.

13. A method of operating a pixel comprising circuitry for outputting an output signal from said pixel to a column line, and a reset circuit having a reset control line for resetting said pixel, said method comprising:
performing a reset of the pixel by:
  controlling a reset of the pixel by selectively applying a voltage to a signal line coupled to both the reset control line of the reset circuit of the pixel and the column line of the pixel, wherein the reset circuit comprises a reset transistor having a gate and a source/drain region, wherein the gate is coupled to the reset control line, and wherein the source/drain region is coupled to the gate.

14. The method of claim 13, wherein said step of performing a reset further comprises:
coupling a voltage source through the reset circuit transistor to a storage node of said pixel.

15. The method of claim 14, wherein the voltage source is the column line.

16. A method of operating a pixel configured to output a pixel signal to a column line that is coupled to a gate of a reset transistor of the pixel, comprising:
performing a reset of the pixel by:
  selectively coupling a floating diffusion node through the reset transistor to a voltage source by applying a voltage on the column line, wherein the reset transistor has a source/drain region that is coupled to the gate.

17. The method of claim 16, further comprising the step of reading an integrated charge signal on said floating diffusion node produced by a photosensor in said pixel.

18. The method of claim 17, further comprising the step of storing in a sample and hold circuit said integrated charge signal.

19. The method of claim 17, further comprising the step of reading an integrated charge signal on said floating diffusion node produced by a second photosensor in said pixel.

20. The method of claim 16, further comprising the steps of:
reading reset and integrated charge signals from said pixel; and
storing said reset and integrated charge signals in a sample and hold circuit.

* * * * *